United States Patent
Fujiwara et al.

(10) Patent No.: US 8,697,564 B2
(45) Date of Patent: Apr. 15, 2014

(54) METHOD OF MANUFACTURING GAN-BASED FILM

(75) Inventors: Shinsuke Fujiwara, Itami (JP); Koji Uematsu, Itami (JP); Yoshiyuki Yamamoto, Itami (JP); Issei Satoh, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 143 days.

(21) Appl. No.: 13/283,963

(22) Filed: Oct. 28, 2011

(65) Prior Publication Data
US 2012/0122301 A1    May 17, 2012

(30) Foreign Application Priority Data

Nov. 16, 2010 (JP) ................................. 2010-255840

(51) Int. Cl.
  *H01L 21/28*     (2006.01)
  *H01L 21/3205*   (2006.01)

(52) U.S. Cl.
  USPC .............................. 438/604; 438/46; 438/93

(58) Field of Classification Search
  USPC .............. 438/46, 93, 602, 604; 257/E21.121; 117/9, 101
  See application file for complete search history.

(56) References Cited

U.S. PATENT DOCUMENTS

| | | | |
|---|---|---|---|
| 5,290,393 A * | 3/1994 | Nakamura | 438/509 |
| 6,413,627 B1 | 7/2002 | Motoki et al. | |
| 2004/0033638 A1 | 2/2004 | Bader et al. | |
| 2008/0169483 A1 | 7/2008 | Kasai et al. | |
| 2008/0296585 A1 | 12/2008 | Matsumoto et al. | |
| 2010/0210089 A1 | 8/2010 | Kasai et al. | |
| 2012/0118222 A1 | 5/2012 | Fujiwara et al. | |
| 2012/0119218 A1 | 5/2012 | Su | |
| 2013/0040442 A1 | 2/2013 | Satoh et al. | |

FOREIGN PATENT DOCUMENTS

| | | |
|---|---|---|
| CN | 1471733 A | 1/2004 |
| CN | 101246899 A | 8/2008 |
| CN | 101319402 A | 12/2008 |
| JP | 4-297023 | 10/1992 |

(Continued)

OTHER PUBLICATIONS

U.S. Office Action dated Jun. 19, 2013 that issued in U.S. Appl. No. 13/643,206 including Double Patenting Rejections on pp. 2-4.

*Primary Examiner* — Thanhha Pham
(74) *Attorney, Agent, or Firm* — Drinker Biddle & Reath LLP

(57) ABSTRACT

A method of manufacturing a GaN-based film includes the steps of preparing a composite substrate, the composite substrate including a support substrate in which a coefficient of thermal expansion in its main surface is more than 0.8 time and less than 1.0 time as high as a coefficient of thermal expansion of GaN crystal in a direction of a axis and a single crystal film arranged on a main surface side of the support substrate, the single crystal film having threefold symmetry with respect to an axis perpendicular to a main surface of the single crystal film, and forming a GaN-based film on the main surface of the single crystal film in the composite substrate, the single crystal film in the composite substrate being an SiC film. Thus, a method of manufacturing a GaN-based film capable of manufacturing a GaN-based film having a large main surface area and less warpage without crack being produced in a substrate is provided.

4 Claims, 2 Drawing Sheets

(56) References Cited

FOREIGN PATENT DOCUMENTS

| | | | |
|---|---|---|---|
| JP | 2000-022212 A | 1/2000 | |
| JP | 2000-044400 A | 2/2000 | |
| JP | 2002-293697 A | 10/2002 | |
| JP | 2006-261476 A | 9/2006 | |
| JP | 2007-523472 | 8/2007 | |
| JP | 2007-246289 A | 9/2007 | |
| JP | 2008-010766 A | 1/2008 | |
| JP | 2010-182936 A | 8/2010 | |
| WO | 2005/076345 | 8/2005 | |

* cited by examiner (A)

(B)

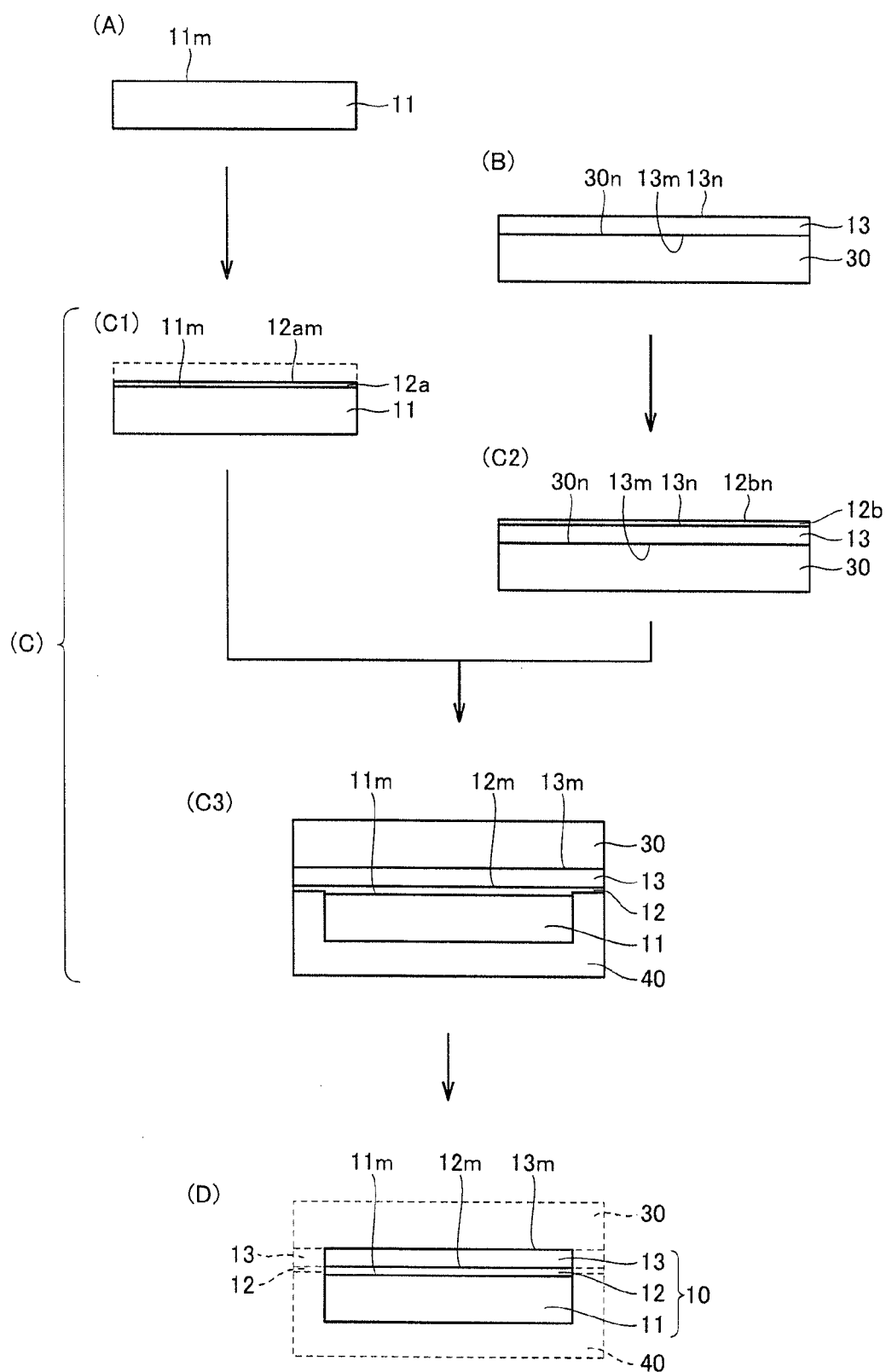

US 8,697,564 B2

METHOD OF MANUFACTURING GAN-BASED FILM

BACKGROUND OF THE INVENTION

1. Field of the Invention

The present invention relates to a method of manufacturing a GaN-based film capable of obtaining a GaN-based film having a large main surface area and less warpage.

2. Description of the Background Art

A GaN-based film is suitably used as a substrate and a semiconductor layer in a semiconductor device such as a light emitting device and an electronic device. A GaN substrate is best as a substrate for manufacturing such a GaN-based film, from a point of view of match or substantial match in lattice constant and coefficient of thermal expansion between the substrate and the GaN-based film. A GaN substrate, however, is very expensive, and it is difficult to obtain such a GaN substrate having a large diameter that a diameter of a main surface exceeds 2 inches.

Therefore, a sapphire substrate is generally used as a substrate for forming a GaN-based film. A sapphire substrate and a GaN crystal are significantly different from each other in lattice constant and coefficient of thermal expansion.

Therefore, in order to mitigate unmatch in lattice constant between a sapphire substrate and a GaN crystal and to grow a GaN crystal having good crystallinity, for example, Japanese Patent Laying-Open No. 04-297023 discloses forming a GaN buffer layer on a sapphire substrate and growing a GaN crystal layer on the GaN buffer layer, in growing GaN crystal on the sapphire substrate.

In addition, in order to obtain a GaN film less in warpage by employing a substrate having a coefficient of thermal expansion close to that of GaN crystal, for example, Japanese National Patent Publication No. 2007-523472 (corresponding to WO2005/076345) discloses a composite support substrate having one or more pairs of layers having substantially the same coefficient of thermal expansion with a central layer lying therebetween and having an overall coefficient of thermal expansion substantially the same as a coefficient of thermal expansion of GaN crystal.

SUMMARY OF THE INVENTION

According to Japanese Patent Laying-Open No. 04-297023 above, GaN crystal grows as warping in a shape recessed in a direction of growth of crystal, probably because crystal defects such as dislocation disappear as a result of association during growth of the GaN crystal.

As described above, however, the sapphire substrate is much higher in coefficient of thermal expansion than GaN crystal, and hence grown GaN crystal greatly warps in a shape projecting in a direction of growth of crystal during cooling after crystal growth and a GaN film great in warpage in a shape projecting in the direction of growth of crystal is obtained. Here, as the main surface of the sapphire substrate has a greater diameter, warpage of the GaN crystal during growth above becomes greater (specifically, warpage of the obtained GaN film is substantially in proportion to a square of a diameter of the main surface of the sapphire substrate). Therefore, it becomes difficult to obtain a GaN film less in warpage as the main surface has a greater diameter. In addition, when GaN crystal grown on a sapphire substrate much higher in coefficient of thermal expansion than GaN crystal is cooled, the sapphire substrate is subjected to large tensile stress and crack is likely.

The composite support substrate disclosed in Japanese National Patent Publication No. 2007-523472 (corresponding to WO2005/076345) above has a coefficient of thermal expansion substantially the same as that of the GaN crystal and hence warpage of the GaN layer grown thereon can be less. Such a composite support substrate, however, has a complicated structure, and design and formation of the structure is difficult. Therefore, cost for design and manufacturing becomes very high and cost for manufacturing a GaN film becomes very high.

An object of the present invention is to solve the problems above and to provide a method of manufacturing a GaN-based film capable of manufacturing a GaN-based film having a large main surface area and less warpage without crack being produced in a substrate.

According to one aspect, the present invention is directed to a method of manufacturing a GaN-based film, including the steps of preparing a composite substrate, the composite substrate including a support substrate in which a coefficient of thermal expansion in a main surface is more than 0.8 time and less than 1.0 time as high as a coefficient of thermal expansion of GaN crystal in a direction of a axis and a single crystal film arranged on a main surface side of the support substrate, the single crystal film having threefold symmetry with respect to an axis perpendicular to a main surface of the single crystal film, and forming a GaN-based film on the main surface of the single crystal film in the composite substrate, the single crystal film in the composite substrate being an SiC film.

In the method of manufacturing a GaN-based film according to the present invention, the main surface of the single crystal film in the composite substrate can have an area equal to or greater than 45 $cm^2$. The support substrate in the composite substrate can be made of a sintered body containing an oxide. The step of forming a GaN-based film can include a sub step of forming a GaN-based buffer layer on the main surface of the single crystal film and a sub step of forming a GaN-based single crystal layer on a main surface of the GaN-based buffer layer.

According to the present invention, a method of manufacturing a GaN-based film capable of manufacturing a GaN-based film having a large main surface area and less warpage without crack being produced in a substrate can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a schematic cross-sectional view showing one example of the step of preparing a composite substrate used in the method of manufacturing a GaN-based film according to the present invention, (A) showing a sub step of preparing a support substrate, (B) showing a sub step of forming a single crystal film on an underlying substrate, (C) showing a sub step of bonding the single crystal film to the support substrate, and (D) showing a sub step of separating the underlying substrate from the single crystal film.

DESCRIPTION OF THE PREFERRED EMBODIMENTS

Figure 1:
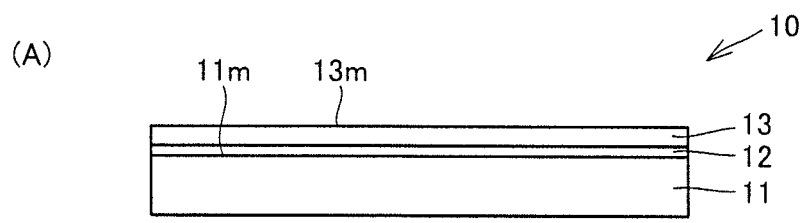
FIG. 1 is a schematic cross-sectional view showing one example of a method of manufacturing a GaN-based film according to the present invention, (A) showing the step of preparing a composite substrate and (B) showing the step of forming a GaN-based film.
Figure 1:
Figure 1:
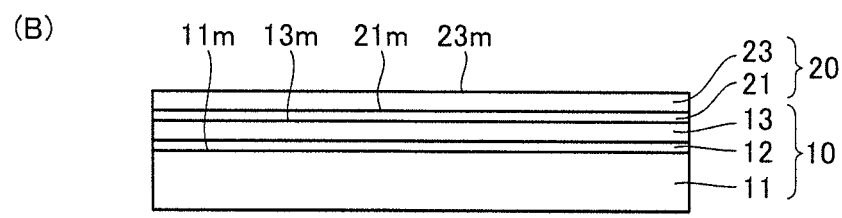

Referring to FIG. 1, one embodiment of a method of manufacturing a GaN-based film according to the present invention includes the steps of preparing a composite substrate 10 including a support substrate 11 in which a coefficient of thermal expansion in a main surface 11$m$ is more than 0.8 time and less than 1.0 time as high as a coefficient of thermal expansion of GaN crystal in a direction of a axis and a single crystal film 13 arranged on a main surface 11$m$ side of support substrate 11, single crystal film 13 having threefold symmetry with respect to an axis perpendicular to a main surface 13$m$ of single crystal film 13 (FIG. 1(A)), and forming a GaN-based film 20 on main surface 13$m$ of single crystal film 13 in composite substrate 10 (FIG. 1(B)). Here, the GaN-based film refers to a film formed of a group III nitride and containing Ga as a group III element and it is exemplified, for example, by a $Ga_xIn_yAl_{1-x-y}N$ film ($x>0$, $y \geq 0$, $x+y \leq 1$).

According to the method of manufacturing a GaN-based film in the present embodiment, by employing a composite substrate including a support substrate in which a coefficient of thermal expansion in a main surface is more than 0.8 time and less than 1.0 time as high as a coefficient of thermal expansion of GaN crystal in a direction of a axis and a single crystal film arranged on a main surface side of the support substrate, the single crystal film having threefold symmetry with respect to an axis perpendicular to a main surface of the crystal film, a GaN-based film having a large main surface area (that is, a large diameter) and less warpage can be obtained.

(Step of Preparing Composite Substrate)

Referring to FIG. 1(A), the method of manufacturing a GaN-based film in the present embodiment includes the step of preparing composite substrate 10 including support substrate 11 in which a coefficient of thermal expansion in main surface 11$m$ is more than 0.8 time and less than 1.0 time as high as a coefficient of thermal expansion of GaN crystal in the direction of a axis and single crystal film 13 arranged on the main surface 11$m$ side of support substrate 11, single crystal film 13 having threefold symmetry with respect to the axis perpendicular to main surface 13$m$ of single crystal film 13.

Composite substrate 10 above includes support substrate 11 in which a coefficient of thermal expansion in main surface 11$m$ is slightly lower than (specifically, more than 0.8 time and less than 1.0 time as high as) a coefficient of thermal expansion of GaN crystal in the direction of a axis and single crystal film 13 arranged on the main surface 11$m$ side of support substrate 11, and single crystal film 13 has threefold symmetry with respect to the axis perpendicular to main surface 13$m$ of single crystal film 13. Therefore, a GaN-based film less in warpage, low in dislocation density, and having a large diameter can be grown on main surface 13$m$ of single crystal film 13 of composite substrate 10.

From a point of view of growing a GaN-based film less in warpage, low in dislocation density, and having a large diameter on single crystal film 13 of composite substrate 10 without crack being produced in composite substrate 10 (in particular, support substrate 11) and without crack being produced in a GaN-based film to be grown, support substrate 11 included in composite substrate 10 above should have a coefficient of thermal expansion in main surface 11$m$ more than 0.8 time and less than 1.0 time as high as a coefficient of thermal expansion of GaN crystal in the direction of a axis. When a coefficient of thermal expansion in main surface 11$m$ of support substrate 11 is not more than 0.8 time as high as a coefficient of thermal expansion of GaN crystal in the direction of a axis, a GaN-based film is subjected to great tensile stress during growth of the GaN-based film and it is subjected to great compressive stress during cooling of the grown GaN-based film, leading to likeliness of crack in the GaN-based film, and when the coefficient of thermal expansion is not less than 1.0 time as high as the above, the support substrate is subjected to tensile stress and cracking thereof is likely during cooling of the grown GaN-based film. From such a point of view, support substrate 11 has a coefficient of thermal expansion in main surface 11$m$ preferably more than 0.88 time and less than 1.0 time and further preferably more than 0.95 time and less than 1.0 time, as high as a coefficient of thermal expansion of GaN crystal in the direction of a axis.

Here, support substrate 11 is not particularly restricted, so long as a substrate has a coefficient of thermal expansion in main surface 11$m$ more than 0.8 time and less than 1.0 time as high as a coefficient of thermal expansion of GaN crystal in the direction of a axis, and a substrate may be monocrystalline, polycrystalline, or non-crystalline. Support substrate 11 is preferably made of a sintered body containing an oxide, from a point of view of ease in adjustment of a coefficient of thermal expansion based on variation in type and ratio of source materials, ease in obtaining a coefficient of thermal expansion in the range above, resistance to an atmosphere in which a GaN-based film is grown, and ability to selectively be etched by such a solvent as hydrofluoric acid after growth of the GaN-based film. For example, preferred examples of the sintered bodies include an $Al_2O_3$—$SiO_2$-based sintered body, an MgO—$SiO_2$ sintered body, a $ZrO_2$—$SiO_2$ sintered body, and the like.

A sintered body containing an oxide, such as an $Al_2O_3$—$SiO_2$-based sintered body, which makes up support substrate 11, tends to suffer from occurrence of crack originating from a large number of pores present therein, and breaking strength thereof is low. The substrate tends to crack in particular when tensile stress is applied thereto. Therefore, in order to prevent application of tensile stress to support substrate 11, in a case where support substrate 11 is made of a sintered body containing an oxide, it is particularly important that a coefficient of thermal expansion in main surface 11$m$ of support substrate 11 is less than 1.0 time as high as a coefficient of thermal expansion of GaN crystal in the direction of a axis.

Here, since a coefficient of thermal expansion of each of support substrate 11 and GaN crystal generally greatly fluctuates depending on a temperature thereof, it is important at which temperature or in which temperature region determination should be made based on a coefficient of thermal expansion. The present invention aims to manufacture a GaN-based film less in warpage on a composite substrate. A GaN-based film is formed on the composite substrate at a film formation temperature for a GaN-based film with a temperature being increased from room temperature, thereafter the temperature is lowered to room temperature, and then the GaN-based film formed on the composite substrate is taken out. Therefore, it is considered as appropriate to handle an average coefficient of thermal expansion of each of the support substrate and the GaN crystal from room temperature to the film formation temperature for the GaN-based film as the coefficient of thermal expansion of each of the support substrate and the GaN crystal. The GaN crystal, however, decomposes even in an inert gas atmosphere if a temperature exceeds 800° C. Therefore, in the present invention, the coefficient of thermal expansion of each of the support substrate and the GaN crystal is determined by an average coefficient of thermal expansion from room temperature (specifically, 25° C.) to 800° C.

In addition, from a point of view of growing a GaN-based film less in warpage, low in dislocation density, and having a large diameter on single crystal film 13 of composite substrate 10, single crystal film 13 arranged on the main surface 11m side of support substrate 11 included in composite substrate 10 above should have threefold symmetry with respect to the axis perpendicular to main surface 13m of single crystal film 13, and preferred examples of the single crystal film include a sapphire film having a (0001) plane as main surface 13m, an SiC film having a (0001) plane as main surface 13m, an Si film having a (111) plane as main surface 13m, a GaAs film having a (111) plane as main surface 13m, and the like. Here, the single crystal film having threefold symmetry with respect to the axis perpendicular to the main surface of the single crystal film does not mean having threefold symmetry strict in terms of crystal geometry but having substantial threefold symmetry in an actual single crystal film, and specifically means that an absolute value of an angle between a threefold symmetry axis strict in terms of crystal geometry of the single crystal film and an axis perpendicular to the main surface of the single crystal film being not greater than 10° suffices.

From a point of view of lessening warpage and lowering dislocation density in composite substrate 10, main surface 11m of support substrate 11 and main surface 13m of single crystal film 13 are preferably substantially parallel to each other. Here, two surfaces being substantially parallel to each other means that an absolute value of an angle formed by these two surfaces is not greater than 10°.

In addition, a method of arranging single crystal film 13 on the main surface 11m side of support substrate 11 of composite substrate 10 is not particularly restricted, and exemplary methods include a method of directly growing single crystal film 13 on main surface 11m of support substrate 11 (a first method), a method of bonding single crystal film 13 formed on a main surface of an underlying substrate to main surface 11m of support substrate 11 and thereafter removing the underlying substrate (a second method), a method of bonding single crystal (not shown) to main surface 11m of support substrate 11 and thereafter separating the single crystal at a plane at a prescribed depth from a bonding surface to thereby form single crystal film 13 on main surface 11m of support substrate 11 (a third method), and the like. In a case where a support substrate is made of a polycrystalline sintered body, the first method above is difficult and hence any of the second and third methods above is preferably employed. A method of bonding single crystal film 13 to support substrate 11 in the second method above is not particularly restricted, and exemplary methods include a method of directly bonding single crystal film 13 to main surface 11m of support substrate 11, a method of bonding single crystal film 13 to main surface 11m of support substrate 11 with an adhesive layer 12 being interposed, and the like. A method of bonding single crystal to support substrate 11 in the third method above is not particularly restricted, and exemplary methods include a method of directly bonding single crystal to main surface 11m of support substrate 11, a method of bonding single crystal to main surface 11m of support substrate 11 with adhesive layer 12 being interposed, and the like.

The step of preparing composite substrate 10 above is not particularly restricted. From a point of view of efficient preparation of composite substrate 10 of high quality, however, for example, referring to FIG. 2, the second method above can include a sub step of preparing support substrate 11 (FIG. 2(A)), a sub step of forming single crystal film 13 on a main surface 30n of an underlying substrate 30 (FIG. 2(B)), a sub step of bonding support substrate 11 and single crystal film 13 to each other (FIG. 2(C)), and a sub step of removing underlying substrate 30 (FIG. 2(D)).

In FIG. 2(C), in the sub step of bonding support substrate 11 and single crystal film 13 to each other, an adhesive layer 12a is formed on main surface 11m of support substrate 11 (FIG. 2(C1)), an adhesive layer 12b is formed on a main surface 13n of single crystal film 13 grown on main surface 30n of underlying substrate 30 (FIG. 2(C2)), thereafter a main surface 12am of adhesive layer 12a formed on support substrate 11 and a main surface 12bn of adhesive layer 12b formed on single crystal film 13 formed on underlying substrate 30 are bonded to each other, and thus support substrate 11 and single crystal film 13 are bonded to each other with adhesive layer 12 formed by joint between adhesive layer 12a and adhesive layer 12b being interposed (FIG. 2(C3)). If support substrate 11 and single crystal film 13 can be joined to each other, however, support substrate 11 and single crystal film 13 can directly be bonded to each other without adhesive layer 12 being interposed.

A specific technique for bonding support substrate 11 and single crystal film 13 to each other is not particularly restricted. From a point of view of ability to hold joint strength even at a high temperature after bonding, however, a direct joint method of washing a bonding surface, performing bonding, and thereafter increasing a temperature to about 600° C. to 1200° C. for joint, a surface activation method of washing a bonding surface, activating the bonding surface with plasma, ions or the like, and thereafter performing joint at a low temperature from around room temperature (for example, 25° C.) to 400° C., and the like are preferably employed.

(Step of Forming GaN-Based Film)

Referring to FIG. 1(B), the method of manufacturing a GaN-based film in the present embodiment includes the step of forming GaN-based film 20 on main surface 13m of single crystal film 13 in composite substrate 10.

Composite substrate 10 prepared in the step of preparing a composite substrate above includes support substrate 11 in which a coefficient of thermal expansion in main surface 11m is slightly lower than (specifically, more than 0.8 time and less than 1.0 time as high as) a coefficient of thermal expansion of GaN crystal in the direction of a axis and single crystal film 13 arranged on the main surface 11m side of support substrate 11, and single crystal film 13 has threefold symmetry with respect to the axis perpendicular to main surface 13m of single crystal film 13. Therefore, GaN-based film 20 less in warpage, low in dislocation density, and having a large diameter can be formed on main surface 13m of single crystal film 13 of composite substrate 10.

Though a method of forming a GaN-based film is not particularly restricted, from a point of view of forming a GaN-based film low in dislocation density, a vapor phase epitaxy method such as an MOCVD (Metal Organic Chemical Vapor Deposition) method, an HYPE (Hydride Vapor Phase Epitaxy) method, an MBE (Molecular Beam Epitaxy) method, and a sublimation method, a liquid phase epitaxy method such as a flux method and a high nitrogen pressure solution method, and the like are preferably exemplified.

The step of forming a GaN-based film is not particularly restricted. From a point of view of forming a GaN-based film low in dislocation density, however, the step preferably includes a sub step of forming a GaN-based buffer layer 21 on main surface 13m of single crystal film 13 of composite substrate 10 and a sub step of forming a GaN-based single crystal layer 23 on a main surface 21m of GaN-based buffer layer 21. Here, GaN-based buffer layer 21 refers to a layer low in crystallinity or non-crystalline, that is a part of GaN-based film 20 and grown at a temperature lower than a growth temperature of GaN-based single crystal layer 23 which is another part of GaN-based film 20.

By forming GaN-based buffer layer 21, unmatch in lattice constant between GaN-based single crystal layer 23 formed on GaN-based buffer layer 21 and single crystal film 13 is mitigated, and hence crystallinity of GaN-based single crystal layer 23 improves and dislocation density thereof is lowered. Consequently, crystallinity of GaN-based film 20 improves and dislocation density thereof is lowered.

GaN-based single crystal layer 23 can also be formed as GaN-based film 20 on single crystal film 13, without growing GaN-based buffer layer 21. Such a method is suitable for a case where unmatch in lattice constant between single crystal film 13 and GaN-based film 20 formed thereon is less.

EXAMPLE 1

1. Measurement of Coefficient of Thermal Expansion of GaN Crystal

A sample for evaluation having a size of 2×2×20 mm (having a axis in a longitudinal direction and having any of a C plane and an M plane as a plane in parallel to the longitudinal direction, with accuracy in plane orientation being within ±0.1°) was cut from GaN single crystal grown with the HVPE method and having dislocation density of $1 \times 10^6$ cm$^{-2}$, Si concentration of $1 \times 10^{18}$ cm$^{-2}$, oxygen concentration of $1 \times 10^{17}$ cm$^{-2}$, and carbon concentration of $1 \times 10^{16}$ cm$^{-2}$.

An average coefficient of thermal expansion of the sample for evaluation above when a temperature was increased from room temperature (25° C.) to 800° C. was measured with TMA (thermomechanical analysis). Specifically, using TMA8310 manufactured by Rigaku Corporation, the coefficient of thermal expansion of the sample for evaluation was measured with differential dilatometry in an atmosphere in which a nitrogen gas flows. An average coefficient of thermal expansion $\alpha_{GaN-a}$ from 25° C. to 800° C. of GaN crystal in the direction of a axis obtained by such measurement was $5.84 \times 10^{-6}$/° C.

2. Step of Preparing Composite Substrate (1) Sub Step of Preparing Support Substrate Referring to FIG. 2(A), a sample for measurement having a size of 2×2×20 mm (having a direction substantially parallel to the main surface of the support substrate cut from a sintered body as the longitudinal direction) was cut from each of eight commercially available Al$_2$O$_3$—SiO$_2$-based sintered bodies A to H as a material for support substrate 11. Here, since the Al$_2$O$_3$—SiO$_2$-based sintered body does not have directional specificity, any cutting direction was set. An average coefficient of thermal expansion $\alpha_S$ of each of these samples for measurement when a temperature was increased from room temperature (25° C.) to 800° C. was measured as described above.

Al$_2$O$_3$—SiO$_2$-based sintered body A attained average coefficient of thermal expansion $\alpha_S$ from 25° C. to 800° C. of $4.2 \times 10^{-6}$/° C. and a ratio of coefficient of thermal expansion $\alpha_S$ of the sintered body to average coefficient of thermal expansion $\alpha_{GaN-a}$ of the GaN crystal in the direction of a axis (hereinafter denoted as an $\alpha_S/\alpha_{GaN-a}$ ratio) was 0.719. Al$_2$O$_3$—SiO$_2$-based sintered body B attained average coefficient of thermal expansion $\alpha_S$ from 25° C. to 800° C. of $4.7 \times 10^{-6}$/° C. and the $\alpha_S/\alpha_{GaN-a}$ ratio of 0.805. Al$_2$O$_3$—SiO$_2$-based sintered body C attained average coefficient of thermal expansion $\alpha_S$ from 25° C. to 800° C. and the $\alpha_S/\alpha_{GaN-a}$ ratio of 0.890. Al$_2$O$_3$—SiO$_2$-based sintered body D attained average coefficient of thermal expansion $\alpha_S$ from 25° C. to 800° C. of $5.4 \times 10^{-6}$/° C. and the $\alpha_S/\alpha_{GaN-a}$ ratio of 0.925. Al$_2$O$_3$—SiO$_2$-based sintered body E attained average coefficient of thermal expansion $\alpha_S$ from 25° C. to 800° C. of $5.5 \times 10^{-6}$/° C. and the $\alpha_S/\alpha_{GaN-a}$ ratio of 0.942. Al$_2$O$_3$—SiO$_2$-based sintered body F attained average coefficient of thermal expansion $\alpha_S$ from 25° C. to 800° C. of $5.6 \times 10^{-6}$/° C. and the $\alpha_S/\alpha_{GaN-a}$ ratio of 0.959. Al$_2$O$_3$—SiO$_2$-based sintered body G attained average coefficient of thermal expansion $\alpha_S$ from 25° C. to 800° C. of $5.7 \times 10^{-6}$/° C. and the $\alpha_S/\alpha_{GaN-a}$ ratio of 0.976. Al$_2$O$_3$—SiO$_2$-based sintered body H attained average coefficient of thermal expansion $\alpha_S$ from 25° C. to 800° C. of $6.2 \times 10^{-6}$/° C. and the $\alpha_S/\alpha_{GaN-a}$ ratio of 1.062.

A support substrate having a diameter of 4 inches (101.6 mm) and a thickness of 1 mm was cut from each of Al$_2$O$_3$—SiO$_2$-based sintered bodies A to H above, and opposing main surfaces of each support substrate were mirror-polished to thereby obtain support substrates A to H. Namely, an average coefficient of thermal expansion of each of support substrates A to H from 25° C. to 800° C. was equal to an average coefficient of thermal expansion of each of Al$_2$O$_3$—SiO$_2$-based sintered bodies A to H from 25° C. to 800° C. Table 1 summarizes the results.

(2) Sub Step of Forming Single Crystal Film on Underlying Substrate

Referring to FIG. 2(B), an Si substrate having a mirror-polished (111) plane as main surface 30n and having a diameter of 5 inches (127 mm) and a thickness of 0.5 mm was prepared as underlying substrate 30.

An SiC film having a thickness of 0.4 μm was formed as single crystal film 13 on main surface 30n of the Si substrate (underlying substrate 30) above with a CVD (chemical vapor deposition) method. Regarding film formation conditions, an SiH$_4$ gas and a C$_3$H$_8$ gas were used as source gases, an H$_2$ gas was used as a carrier gas, a film formation temperature was set to 1300° C., and a film formation pressure was set to an atmospheric pressure. In main surface 13m of the SiC film (single crystal film 13) thus obtained included an Si atomic plane (a (0001) plane) and a C atomic plane (a (000-1) plane) as mixed like mosaic.

(3) Sub Step of Bonding Support Substrate and Single Crystal Film to Each Other

Referring to (C1) in FIG. 2(C), an SiO$_2$ film having a thickness of 2 μm was formed on main surface 11m of each of support substrates A to H (support substrate 11) in FIG. 2(A) with the CVD method. Then, by polishing the SiO$_2$ film having a thickness of 2 μm on main surface 11m of each of support substrates A to H (support substrate 11) with CeO$_2$ slurry, only the SiO$_2$ film having a thickness of 0.2 μm was allowed to remain to serve as adhesive layer 12a. Thus, pores in main surface 11m of each of support substrates A to H (support substrate 11) were buried to thereby obtain the SiO$_2$ film (adhesive layer 12a) having flat main surface 12am and a thickness of 0.2 μm.

Referring also to (C2) in FIG. 2(C), main surface 13n of the SiC film (single crystal film 13) formed on the Si substrate (underlying substrate 30) in FIG. 2(B) was oxidized in an oxygen atmosphere at 1000° C. to thereby form an SiO$_2$ layer (adhesive layer 12b) having a thickness of 0.2 μm on main surface 13n of the SiC film (single crystal film 13).

Referring next to (C3) in FIG. 2(C), main surface 12am of the SiO$_2$ film (adhesive layer 12a) formed on each of support substrates A to H (support substrate 11) and main surface 12bn of the SiO$_2$ layer (adhesive layer 12b) formed on the SiC film (single crystal film 13) formed on the Si substrate (underlying substrate 30) were cleaned and activated by argon plasma, and thereafter main surface 12am of the SiO$_2$ film (adhesive layer 12a) and main surface 12bn of the SiO$_2$ layer (adhesive layer 12b) were bonded to each other, followed by heat treatment for 2 hours in a nitrogen atmosphere at 300° C.

(4) Sub Step of Removing Underlying Substrate

Referring to FIG. 2(D), a main surface on a back side (a side where single crystal film 13 was not bonded) and a side surface of each of support substrates A to H (support substrate 11) were covered and protected with wax 40, and thereafter the Si substrate (underlying substrate 30) was removed by etching using a mixed acid aqueous solution of hydrofluoric acid and nitric acid. Thus, composite substrates A to H in which SiC films (single crystal films 13) were arranged on the main surface 11m sides of support substrates A to H (support substrates 11) respectively were obtained.

3. Step of Forming GaN-Based Film

Referring to FIG. 1(B), a GaN film (GaN-based film 20) was formed with the MOCVD method on main surface 13m of the SiC film (single crystal film 13) of each of composite substrates A to H (composite substrate 10) (such a main surface being a (0001) plane, a (000-1) plane, or these planes as mixed) and on a main surface of a sapphire substrate having a diameter of 4 inches (101.6 mm) and a thickness of 1 mm (such a main surface being a (0001) plane). In forming the GaN film (GaN-based film 20), a TMG (trimethylgallium) gas and an NH$_3$ gas were used as source gases, an H$_2$ gas was used as a carrier gas, and a GaN buffer layer (GaN-based buffer layer 21) was grown to a thickness of 0.1 μm at 500° C. and then a GaN single crystal layer (GaN-based single crystal layer 23) was grown to a thickness of 5 μm at 1050° C. Here, a rate of growth of the GaN single crystal layer was 1 μm/hr. Thereafter, wafers A to H and R in which GaN films were formed on composite substrates A to H and the sapphire substrate respectively were cooled to room temperature (25° C.) at a rate of 10° C./min.

Regarding wafers A to H and R taken out of a film formation apparatus after cooling to room temperature, warpage of the wafer as well as appearance and dislocation density of the GaN film were measured. Here, a shape of warpage and an amount of warpage of the wafer at the main surface of the GaN film were determined with FM200EWafer of Corning Tropel, appearance of the GaN film was observed with a Nomarski microscope, and dislocation density of the GaN film was measured with CL (cathode luminescence) based on density of dark points.

Wafer A warped on the GaN film side in a recessed manner, an amount of warpage was 700 μm, and a large number of cracks were produced in the GaN film. Wafer B warped on the GaN film side in a recessed manner, an amount of warpage was 650 μm, no crack was produced in the GaN film, and dislocation density of the GaN film was 4×10$^8$ cm$^{-2}$. Wafer C warped on the GaN film side in a recessed manner, an amount of warpage was 400 μm, no crack was produced in the GaN film, and dislocation density of the GaN film was 3×10$^8$ cm$^{-2}$. Wafer D warped on the GaN film side in a recessed manner, an amount of warpage was 350 μm, no crack was produced in the GaN film, and dislocation density of the GaN film was 2.5×10$^8$ cm$^{-2}$. Wafer E warped on the GaN film side in a recessed manner, an amount of warpage was 320 μm, no crack was produced in the GaN film, and dislocation density of the GaN film was 2×10$^8$ cm$^{-2}$. Wafer F warped on the GaN film side in a recessed manner, an amount of warpage was 230 μm, no crack was produced in the GaN film, and dislocation density of the GaN film was 1×10$^8$ cm$^{-2}$. Wafer G warped on the GaN film side in a recessed manner, an amount of warpage was 200 μm, no crack was produced in the GaN film, and dislocation density of the GaN film was 1×10$^8$ cm$^{-2}$. In wafer H, cracking occurred in support substrate H and a sufficient GaN film was not obtained. Wafer R warped on the GaN film side in a projecting manner, an amount of warpage was 1500 μm, no crack was produced in the GaN film, and dislocation density of the GaN film was 4×10$^8$ cm$^{-2}$. Table 1 summarizes these results. In Table 1, "–" indicates that that physical property value was not measured.

TABLE 1

| | | Wafer A | Wafer B | Wafer C | Wafer D | Wafer E | Wafer F | Wafer G | Wafer H | Wafer R |
|---|---|---|---|---|---|---|---|---|---|---|
| Substrate | Coefficient of Thermal Expansion $\alpha_S$ (10$^{-6}$/° C.) | 4.2 | 4.7 | 5.2 | 5.4 | 5.5 | 5.6 | 5.7 | 6.2 | — |
| | $\alpha_S/\alpha_{GaN-a}$ Ratio | 0.719 | 0.805 | 0.890 | 0.925 | 0.942 | 0.959 | 0.976 | 1.062 | — |
| Wafer | Shape of Warpage [GaN Film Side] | Recess | Recess | Recess | Recess | Recess | Recess | Recess | — | Projection |
| | Amount of Warpage [GaN Film] (μm) | 700 | 650 | 400 | 350 | 320 | 230 | 200 | — | 1500 |
| | Production of Crack in GaN Film | Many | None | None | None | None | None | None | — | None |
| | Dislocation Density of GaN Film (10$^8$ cm$^{-2}$) | — | 4 | 3 | 2.5 | 2 | 1 | 1 | — | 4 |
| Notes | | | | | | | | | Crack in Support Substrate | |

Referring to Table 1, by employing a composite substrate (wafers B to G) having a support substrate in which coefficient of thermal expansion $\alpha_S$ in a main surface was more than 0.8 time and less than 1.0 time (that is, 0.8<($\alpha_S/\alpha_{GaN-a}$ ratio) <1.0) as high as coefficient of thermal expansion $\alpha_{GaN-a}$ of GaN crystal in the direction of a axis, as compared with a case where a sapphire substrate was employed (wafer R), a GaN film extremely less in warpage could be formed. In addition, from a point of view of further decrease in warpage and dislocation density of the GaN film in the wafer, coefficient of thermal expansion $\alpha_S$ in a main surface of the support substrate of the composite substrate was preferably more than 0.88 time and less than 1.0 time (that is, $0.88<(\alpha_S/\alpha_{GaN-a}$ ratio$)<1.0$) as high as coefficient of thermal expansion $\alpha_{GaN-a}$ of the GaN crystal in the direction of a axis (wafers C to G) and further preferably more than 0.95 time and less than 1.0 time (that is, $0.95<(\alpha_S/\alpha_{GaN-a}$ ratio$)<1.0$) as high as coefficient of thermal expansion $\alpha_{GaN-a}$ of the GaN crystal in the direction of a axis (wafers F and G).

Though a case where a non-doped GaN film was formed on the composite substrate was shown in the example above, substantially the same results as in the example above were obtained also in a case where a GaN film provided with n- or p-type conductivity by doping was formed and in a case where a GaN film of which resistivity was raised by doping was formed.

Further, in a case of forming a GaN-based film such as a $Ga_xIn_yAl_{1-x-y}N$ film ($x>0$, $y\geq0$, $x+y\leq1$) instead of a GaN film as well, results as in the example above were obtained. In particular, in a case of forming a $Ga_xIn_yAl_{1-x-y}N$ film ($0.5<x<1$, $y\geq0$, $x+y\leq1$) instead of a GaN film, substantially the same results as in the example above were obtained.

Furthermore, a plurality of GaN-based films (specifically, $Ga_xIn_yAl_{1-x-y}N$ films ($x>0$, $y\geq0$, $x+y\leq1$) and the like)) can be formed by varying a composition ratio of such a group III element as Ga, In and Al. Namely, a plurality of GaN-based films such as $Ga_xIn_yAl_{1-x-y}N$ films ($x>0$, $y\geq0$, $x+y\leq1$) and the like instead of a GaN film can be formed by varying a composition ratio of such a group III element as Ga, In and Al.

In carrying out the present invention, a known dislocation lowering technique such as an ELO (Epitaxially Lateral Overgrowth) technique is applicable in forming a GaN-based film.

In addition, after the GaN-based film is formed on the composite substrate, only the support substrate of the composite substrate or the entire composite substrate (the support substrate and the single crystal film) may be etched away. Here, the GaN-based film may be transferred to another support substrate.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a GaN-based film, comprising the steps of:
   preparing a composite substrate, the composite substrate including a support substrate in which a coefficient of thermal expansion in a main surface is more than 0.8 time and less than 1.0 time as high as a coefficient of thermal expansion of GaN crystal in a direction of a axis and a single crystal film arranged on a main surface side of said support substrate, said single crystal film having threefold symmetry with respect to an axis perpendicular to a main surface of said single crystal film; and
   forming a GaN-based film on the main surface of said single crystal film in said composite substrate,
   said single crystal film in said composite substrate being an SiC film.

2. The method of manufacturing a GaN-based film according to claim 1, wherein
   said main surface of said single crystal film in said composite substrate has an area equal to or greater than 45 cm$^2$.

3. The method of manufacturing a GaN-based film according to claim 1, wherein
   said support substrate in said composite substrate is made of a sintered body containing an oxide.

4. The method of manufacturing a GaN-based film according to claim 1, wherein
   said step of forming a GaN-based film includes a sub step of forming a GaN-based buffer layer on the main surface of said single crystal film and a sub step of forming a GaN-based single crystal layer on a main surface of said GaN-based buffer layer.

* * * * *